US005235342A

United States Patent [19]

Orton et al.

[11] Patent Number: 5,235,342

[45] Date of Patent: Aug. 10, 1993

[54] ANTENNA ARRAY WITH SYSTEM FOR LOCATING AND ADJUSTING PHASE CENTERS OF ELEMENTS OF THE ANTENNA ARRAY

[75] Inventors: Richard S. Orton; Paul J. Tittensor, both of Chelmsford, United Kingdom

[73] Assignee: GEC-Marconi, Ltd., Middlesex, United Kingdom

[21] Appl. No.: 883,904

[22] Filed: May 18, 1992

Related U.S. Application Data

[63] Continuation of Ser. No. 569,130, Aug. 17, 1990, abandoned.

[30] Foreign Application Priority Data

Aug. 30, 1989 [GB] United Kingdom ................. 8919623

[51] Int. Cl.$^5$ ..................... G01R 29/080; H01Q 21/20

[52] U.S. Cl. ................................. 343/703; 343/792.5

[58] Field of Search .............................. 342/173, 372; 343/792.5, 703, 853; 455/103-105

[56] References Cited

U.S. PATENT DOCUMENTS

| | | | |
|---|---|---|---|
| 3,765,022 | 10/1973 | Tanner | 343/792.5 |
| 4,360,816 | 11/1982 | Corzine | 343/792.5 |
| 4,517,570 | 5/1985 | Gray, Jr. | 342/372 |
| 4,554,551 | 11/1985 | Frazita | 343/703 |
| 4,864,315 | 9/1989 | Mohuchy | 343/703 |
| 4,870,423 | 9/1989 | Bolomey | 342/368 |

FOREIGN PATENT DOCUMENTS

| | | | |
|---|---|---|---|
| 0106438 | 9/1982 | European Pat. Off. . | |
| 0194244 | 3/1985 | European Pat. Off. . | |
| 0241380 | 4/1986 | European Pat. Off. . | |
| 1334231 | 8/1987 | U.S.S.R. | 343/703 |
| 1394166 | 5/1988 | U.S.S.R. | 343/703 |
| 1474563 | 4/1989 | U.S.S.R. | 343/703 |

OTHER PUBLICATIONS

IEEE, Test Procedure for Antennas pp. 1-3 and 15-17 Jan. 15, 1965 IEEE No. 149.

Translation of SU Patent Document 1334231, Seryakov et al., Aug., 1987, 7 pp.

Lex et al., NU 156-Mod. VHF Trans. System for Air--Traffic Control, News from Rohde & Schwarz vol. 14 No. 66, pp. 17-17, 1974.

*Primary Examiner*—Rolf Hille
*Assistant Examiner*—Peter T. Brown
*Attorney, Agent, or Firm*—Spencer, Frank & Schneider

[57] ABSTRACT

In an antenna array consisting of a plurality of antennas, an antenna may behave as if its transmitted radiation emanates from a position, phase center, disposed away from the actual location. Probe antennas are used with a processor to locate the phase center of respective antennas at a selected frequency of transmission and to adjust the phase center to a desired location, thereby calibrating the antenna array for the selected frequency.

12 Claims, 1 Drawing Sheet

ANTENNA ARRAY WITH SYSTEM FOR LOCATING AND ADJUSTING PHASE CENTERS OF ELEMENTS OF THE ANTENNA ARRAY

This application is a continuation of application Ser. No. 07/569,130, filed Aug. 17, 1990, now abandoned.

BACKGROUND OF THE INVENTION

1. Field of the Invention

This invention relates to the calibration of transmit antenna arrays.

The invention relates particularly to phased antenna arrays in which the transmitter connected to each antenna of the array includes phase shifters, to enable the individual antennas to be fed at different phases relative to each other in order to steer the transmitted beam.

2. Background Information

The inventors were concerned with antenna arrays for high frequency (HF) radar and in particular log periodic dipole arrays, an example of which (with four elements and five dipoles to an element) is shown in FIG. 1. The series of dipoles D forming each element 1, 2, 3, 4 of the array were fed at the front end, parallel wires W conducting the energy to the dipoles behind, and the radiating signal appeared along the boresight B of the element. The elements could be energized at different frequencies, and only certain dipoles within each element were energized for any given frequency. While investigating such antennas, the applicants made the discovery that, for any given element of the array, the center from which radiation appeared to be propagated, the so-called active region or phase center did not coincide exactly with the particular dipole that was being energized, but could instead be displaced from the center of the dipole, either along the direction of the element, or transverse to that direction, or both.

SUMMARY OF THE INVENTION

The invention provides apparatus for calibrating a transmit antenna array, which comprises two or more probe antennas spaced apart from each other and in the near or intermediate field region of the antenna array, and means for determining the location of a phase center of one of the antennas of the array from the phase at the two or more probe antennas of a signal transmitted by the one antenna of the array.

The phase measurements at the two or more probe antennas enables the phase center of the one antenna of the array that is excited to be determined. This knowledge can be used to apply phase shifts to the respective transmitter at the respective frequency to compensate for any deviation of the phase center from its expected position.

DETAILED DESCRIPTION OF THE PREFERRED EMBODIMENT

Figure 2:
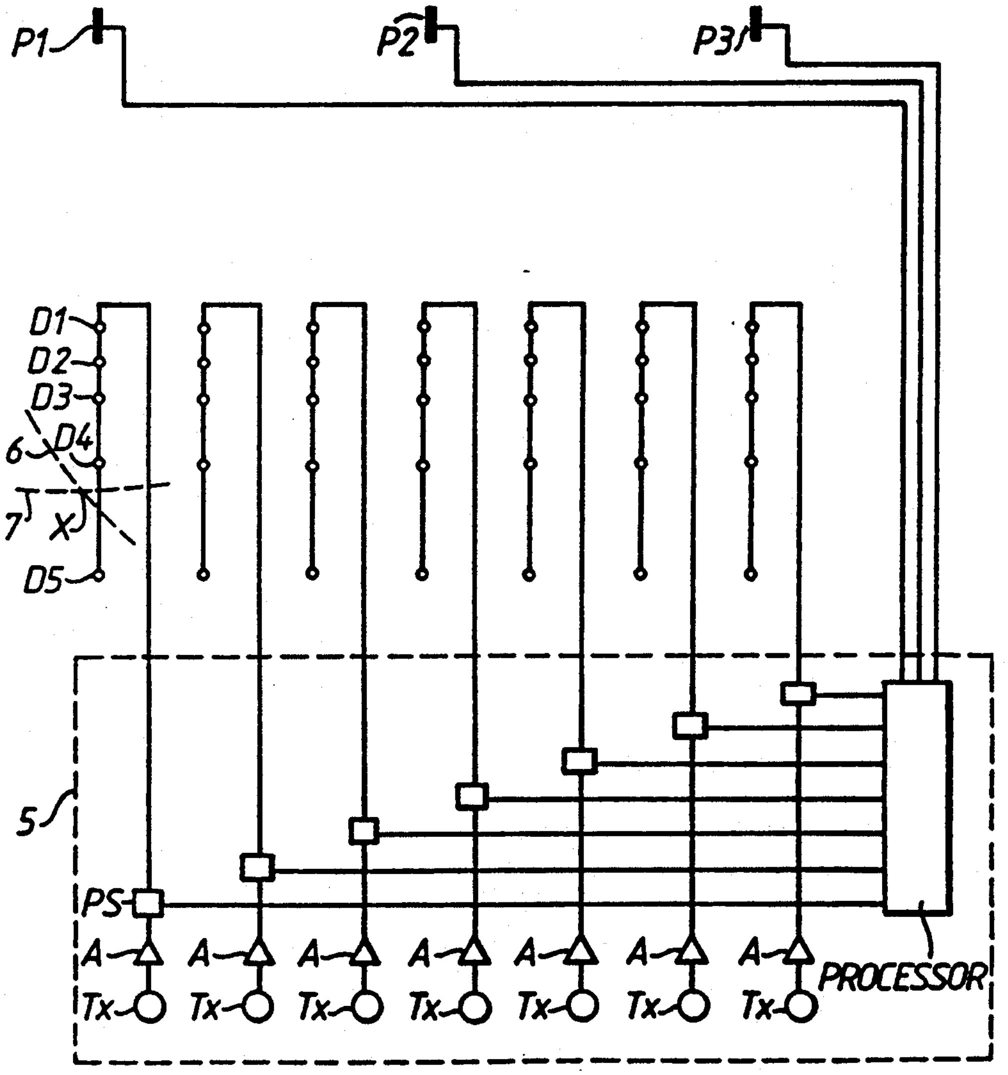
FIG. 2 is a partly schematic, partly plan view of an array and apparatus according to an embodiment of the invention.

Apparatus for and method of calibrating a transmit antenna array, constructed in accordance with the invention, will now be described by way of example with reference to FIG. 2 of the accompanying drawings, which is a partly schematic, partly plan view of the array and apparatus.

Figure 1:
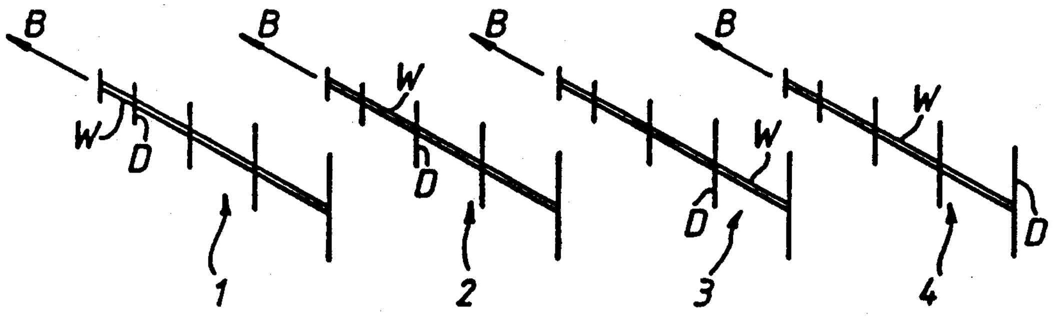
Fig.1. PRIOR ART
FIG. 1 is an example of a conventional log periodic dipole array.

A phased array of seven log periodic dipole antennas is shown. Each antenna consists of five vertically arranged dipoles D1–D5. Only the dipoles for the antenna on the extreme left are numbered. The dipoles are fed in the conventional manner from a co-axial cable which is connected via a transformer forming a blunt (not shown) to the center of the first dipole D1 of the array. Parallel wires W (shown in FIG. 1) running the length of the antenna are connected to the centers of the other dipoles.

The shortest element is Dl and the longest is D5. The direction in which the radiation is propagated is shown as the direction B in FIG. 1.

Power is fed to each antenna from its own transmitter Tx, the signal from which is amplified in a power amplifier A and fed to the co-axial cable via a phase shifter PS. These are all arranged at a control location 5 remote from the antennas. It is a property of log periodic antennas that they radiate or, for that matter receive, over a range of different frequencies, and for any particular frequency only one or two dipoles of the array are energized. The highest frequencies are radiated at the shortest dipole D1 and the lowest frequencies at the longest dipole D5. The antenna could typically operate in the HF band of from 3 to 30 MHz.

If all the antennas are driven with the same amplitude and phase, as might be expected the beam is directed forwardly. If the antennas are driven with linear phase slope, e.g., g antenna on the left at 0° phase, the next driven at 10° phase, the next at 20° phase and so on, the beam is steered and is directed at an angle to the straight ahead direction. It can be shown that to direct the beam at an angle of $\Theta^o$ relative to a straight ahead direction at the center of the array, the phase shift for each antenna is given by $$\phi = \frac{2\pi d \sin \Theta}{\lambda}$$

where d is the separation of the antennas and λ is the wavelength of the radiation being propagated.

In an HF array, which could be quite large, the lengths of the co-axial cables joining the transmitters Tx from the central location 5 to each antenna will in general be different, and hence the same signal generated by each transmitter Tx will in general have a different amplitude and phase when it reaches the respective antenna. While it might in principle be possible to measure this and correct for it, the situation is more complicated than this because when an antenna radiates, adjacent antennas pick up and re-radiate the signal.

The Inventors have discovered that the effect of this is that the actual phase center from which a dipole appears to radiate may be displaced from the center of the dipole, not only along the length of the antenna, but also in a transverse direction relative to the dipole. For example, when it radiates, dipole D4 of the left hand antenna may appear to radiate from the adjacent position marked with "X".

In accordance with the invention, the Applicants provide three probe antennas P1, P2, P3 (field detecting probes) in the near or intermediate field region of the antenna array. The boundary between the intermediate and far field region of the antenna array is approximately a distance in front of the array given by $$\frac{2D^2}{\lambda}$$

where D is the antenna aperture, which is the separation between the antenna on the left and that on the right, and λ is the wavelength of the radiation beam propagated.

These probe antennas are used in the following way. The antenna at the left of the array is energized at a particular frequency with the transmitter Tx operated at a known amplitude and phase, and the amplitude and phase of signals received by the probe antennas P1, P3 are measured. Assuming that the frequency is such that the dipole D4 radiates, the phase of the signal at P3 is compared with that of the transmitter. The processor will contain data indicating the expected phase shift between the dipole D4 and the probe antenna P3 were the dipole D4 to radiate from its actual physical center. The consequent error signal is calculated, and his enables an imaginary circle 6 to be drawn centered on P3 indicating the locus of points on which the actual phase center from which the dipole appears to radiate must lie. The phase of the signal received at P1 is then compared with that transmitted by transmitter Tx, and this relative phase is gain compared with the data in the processor which indicted from geometrical considerations that expected relative phase between the dipole D4 and the antenna P1 were dipole D4 radiating at its actual physical center. A second error phase is derived and enables a second circular locus, this time centered on P1, to be calculated.

The intersection of circles 6 and 7 pinpoints the actual phase center from which the dipole appears to radiate for that frequency for that antenna. Error signals can now be stored in the processor to be fed to the phase shifters PS whenever that frequency is radiated from that antenna to correct for the error between the actual phase center and the expected phase center. For example, the correction could be such that the phase of the transmitter is advanced so that the circle centered on P3 now passes through dipole D4.

The calibration is repeated for frequencies relevant to each dipole for the antenna at the left, and then the procedure is repeated for each other antenna.

The inclusion of P2 as well increases the accuracy of the detection, since a majority decision can be taken from the results obtained from the antennas. However, two probe antennas only could be used if desired, and equally more than three could also be used if desired.

The probe antennas are lops which are large enough to provide an output at the processor, but no larger than that in order not to affect the performance of the antenna array. Other probe antennas such as electrically short dipoles or monopolies may be used instead of loops.

The array may be calibrated when starting up operation, and also periodically during use to compensate for variations in component values due to aging.

The probe antennas are shown as loops arranged in a line broadside to the antenna array, but that they may be arranged different positions is desired.

We claim:

1. Apparatus for calibrating a transmit antenna array having a plurality of antennas, the transmit antenna array operating at frequencies in the range of 3 to 30 megahertz, each antenna including a row of elements in a log periodic configuration, the apparatus comprising:

a plurality of probe antennas spaced apart from each other and disposed in one of a near and an intermediate field region of the antenna array for receiving signals transmitted by respective antennas of the array; and processing means for determining the location of a phase center of a respective antenna of the array at one selected frequency of transmission by processing a received signal to determine the phase at the probe antennas of the received signal transmitted by the respective antenna of the array, the processing means containing data to indicate the selected phase shift between the respective element and each probe antenna at that selected frequency, a phase sifter being connected to the respective antennas of the array, said processing means being operative to adjust the phase shifter when transmitting at the selected frequency by an amount dependent upon the determined location of the respective phase center.

2. Calibration apparatus as claimed in claim 1, in which each antennas of the array comprises at least one dipole, and wherein the processing means compares the phase of the signal received at a probe antenna with an associated expected phase for a respective dipole of the respective antenna of the array, the associated expected phase being based on the frequency and wavelength of transmission, and the distance of the respective dipole from the probe antenna.

3. Calibration apparatus as claimed in claim 2, in which the processing means produces an error signal from the received an the expected phases and adjusts the phase shifter connected to the respective antenna of the array in dependence on the error signal.

4. Calibration apparatus as claimed in claim 1, wherein each antenna of the array is a log periodic antenna having a boresight and comprising dipoles arranged in a straight line along said boresight, the corresponding dipoles of each antenna of the array being arranged in straight lines with respective dipoles of the other antennas of the array, the bore sights of the antennas of the array being parallel to the one another.

5. Calibration apparatus as claimed in claim 1, wherein three probe antennas are provided.

6. Calibration apparatus as claimed in claim 4, wherein the probe antennas are arranged in a line broadside to the bore sights of the antennas of the array.

7. The apparatus of claim 1 wherein the elements are dipole elements.

8. The apparatus of claim 1, wherein the rows of elements are arranged side-by-side and parallel to one another.

9. The apparatus of claim 1 wherein the transit antennas array is a phased array.

10. A method of calibrating a transmit antenna array having a plurality of antennas, the transmit antennas array operating at frequencies in the range of 3 to 30 megahertz, each antenna including a row of elements in a log periodic configuration, the method comprising:

taking measurement of the phase of a signal at one selected frequency transmitted by a respective one of the antennas of the array to a plurality of positions spaced apart in one of a near and an intermediate field region of the antenna array;

determining the location of a phase center of the respective one of the antennas from the measurements utilizing data indicating the excited phase shift between the respective element and each probe antenna at that selected frequency; and applying an off-set to the phase of the signal transmitted by the respective one of the antennas dependent on the determined location of the phase center.

11. An antenna array comprising:

a plurality of transmit antennas for transmitting signals, each transmit antenna being operatively connected to one of a like plurality of phase shifters, each phase shifter being connected to an associated amplifier and transmitter;

a plurality of probe antennas disposed to receive signals transmitted form the transmit antennas;

processing means connected to each of the phase shifters and connected to the probe antennas, for determining the location of a phase center of a respective transit antenna at on selected frequency of transmission by processing a received signal to determine the phase at the probe antennas of the received signal transmitted by the respective transmit antenna, and for controlling the phase shifters based on the determined location of the respective phase center, the processing means containing data to indicate the expected phase shift between the respective element and each probe antenna at that selected frequency;

wherein the transmit antennas each comprise a plurality of dipoles in a log periodic configuration.

12. The antenna array according to claim 11, wherein three probe antennas are provided.

* * * * *